United States Patent
Ueda et al.

(10) Patent No.: US 8,217,555 B2
(45) Date of Patent: Jul. 10, 2012

(54) ACTUATOR AND METHOD FOR DRIVING ACTUATOR

(75) Inventors: Michihito Ueda, Kyoto (JP); Takakiyo Harigai, Kyoto (JP); Yoshiaki Tanaka, Nara (JP); Hideaki Adachi, Osaka (JP); Eiji Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/282,089

(22) Filed: Oct. 26, 2011

(65) Prior Publication Data

US 2012/0043857 A1    Feb. 23, 2012

Related U.S. Application Data

(63) Continuation of application No. PCT/JP2011/003400, filed on Jun. 15, 2011.

(30) Foreign Application Priority Data

Aug. 23, 2010   (JP) .................................. 2010-185762

(51) Int. Cl.
*H01L 41/187* (2006.01)
*H01L 41/24* (2006.01)

(52) U.S. Cl. ..................................................... 310/358
(58) Field of Classification Search .................... 310/358
See application file for complete search history.

(56) References Cited

U.S. PATENT DOCUMENTS

| | | | |
|---|---|---|---|
| 5,966,787 A | 10/1999 | Nakayama et al. | |
| 7,965,021 B2 * | 6/2011 | Harigai et al. | 310/358 |
| 2005/0127795 A1 | 6/2005 | Torii et al. | |
| 2006/0119229 A1 * | 6/2006 | Koizumi et al. | 310/358 |
| 2009/0273652 A1 | 11/2009 | Kazama et al. | |
| 2010/0194245 A1 * | 8/2010 | Harigai et al. | 310/363 |
| 2011/0143146 A1 * | 6/2011 | Harigai et al. | 428/446 |

FOREIGN PATENT DOCUMENTS

| | | | |
|---|---|---|---|
| JP | 05-187867 A | | 7/1993 |
| JP | 11180769 A | * | 7/1999 |
| JP | 2005-203725 A | | 7/2005 |
| JP | 2007266346 A | * | 10/2007 |
| JP | 2008186985 A | * | 8/2008 |
| JP | 2008192672 A | * | 8/2008 |
| JP | 2009-049065 | | 3/2009 |
| JP | 2009-049065 A | | 3/2009 |
| JP | 2009-286119 A | | 12/2009 |

OTHER PUBLICATIONS

Japanese Office Action issued in Japanese Patent Application No. 2011-542605 dated Jan. 10, 2012.

* cited by examiner

*Primary Examiner* — J. San Martin
(74) *Attorney, Agent, or Firm* — McDermott Will & Emery LLP

(57) ABSTRACT

The purpose of the present invention is to provide a method for driving an actuator in which unnecessary deformation is suppressed.

The present invention provides a method for driving an actuator, comprising the following steps (a) and (b):

a step (a) of preparing the actuator, wherein the actuator comprises a first electrode, a piezoelectric layer composed of $(Bi,Na,Ba)TiO_3$, and a second electrode, the piezoelectric layer is interposed between the first electrode and the second electrode, +X direction, +Y direction, and +Z direction denote [100] direction, [01-1] direction, and [011] direction, respectively, and the piezoelectric layer is preferentially oriented along the +Z direction; and a step (b) of applying a potential difference between the first electrode and the second electrode to drive the actuator.

8 Claims, 9 Drawing Sheets

ACTUATOR AND METHOD FOR DRIVING ACTUATOR

RELATED APPLICATIONS

This application is continuation of International Application No. PCT/JP2011/003400, filed on Jun. 15, 2011, which in turn claims the benefit of Japanese Application No. 2010-185762, filed on Aug. 23, 2010, the disclosures of which applications are incorporated by reference herein.

TECHNICAL FIELD

The present invention relates to an actuator comprising a piezoelectric film and a method for driving the actuator.

BACKGROUND ART

FIGS. 10A and 10B show a structure of a prior actuator and a method for driving the same.

As shown in FIG. 10A, the prior actuator 101 comprises a substrate 103, a first electrode 105, a piezoelectric layer 107, and a second electrode 109 in this order. A laminate 111 is composed of the substrate 103, the first electrode 105, the piezoelectric layer 107, and the second electrode 109. One end portion of the laminate 111 is immobilized with a support 113.

As shown in FIG. 10B, a potential difference is applied between the first electrode 105 and the second electrode 109 with a power source 121. The potential difference causes an electrostriction in the in-plane direction of the piezoelectric layer 107. As a result, the piezoelectric layer 107 is caused to be elongated along the X direction, whereas the substrate 103 is remained to be not elongated. Thus, the other end portion of the actuator 101 is displaced along the −Z direction.

CITATION LIST

Patent Document

[Patent Document 1] Unexamined Japanese Patent Publication No. H05-187867

SUMMARY OF INVENTION

Technical Problem

However, when a potential difference is applied to the prior actuator, a stress due to a piezoelectric effect is generated uniformly in the plane of the piezoelectric layer. Accordingly, as shown in FIG. 5A, the actuator is elongated also along the Y direction as well as along the X direction. As a result, the other end portion is deformed so that it is bent along the Y direction.

The purpose of the present invention is to provide a method for driving an actuator in which unnecessary deformation is suppressed.

Solution to Problem

The present invention provides a method for driving an actuator, comprising the following steps (a) and (b):

a step (a) of preparing the actuator, wherein the actuator comprises a first electrode, a piezoelectric layer composed of $(Bi,Na,Ba)TiO_3$, and a second electrode, the piezoelectric layer is interposed between the first electrode (5) and the second electrode, +X direction, +Y direction, and +Z direction denote [100] direction, [01-1] direction, and [011] direction, respectively, and the piezoelectric layer is preferentially oriented along the +Z direction; and a step (b) of applying a potential difference between the first electrode and the second electrode to drive the actuator.

Advantageous Effect of the Invention

The present invention provides a method for driving an actuator in which the amount of the displacement along the X direction is much greater than the amount of the deformation along the Y direction.

DESCRIPTION OF EMBODIMENTS

An embodiment of the present invention is described below with reference to figures.

First Embodiment

Figure 1:
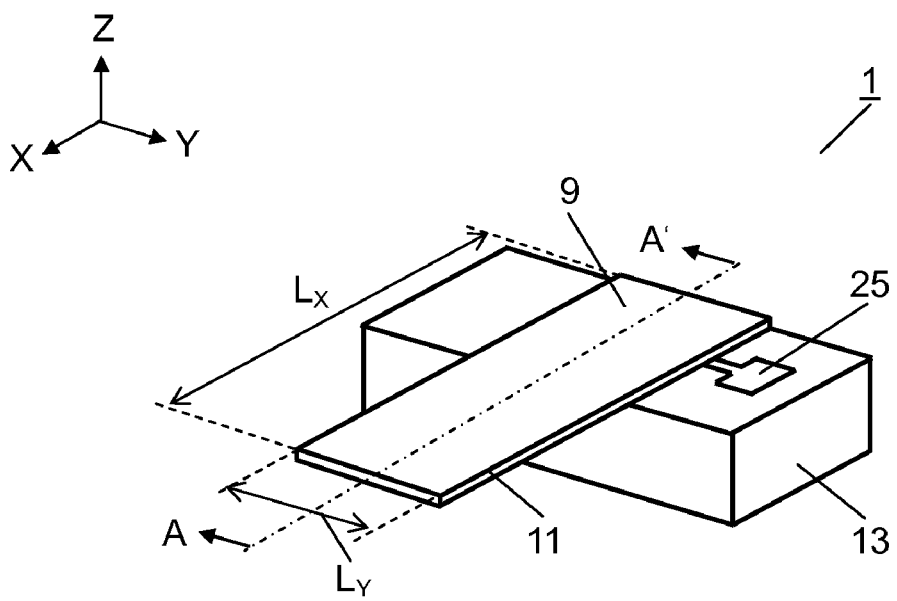
FIG. 1 is a schematic perspective view of the present actuator.
Figure 3:
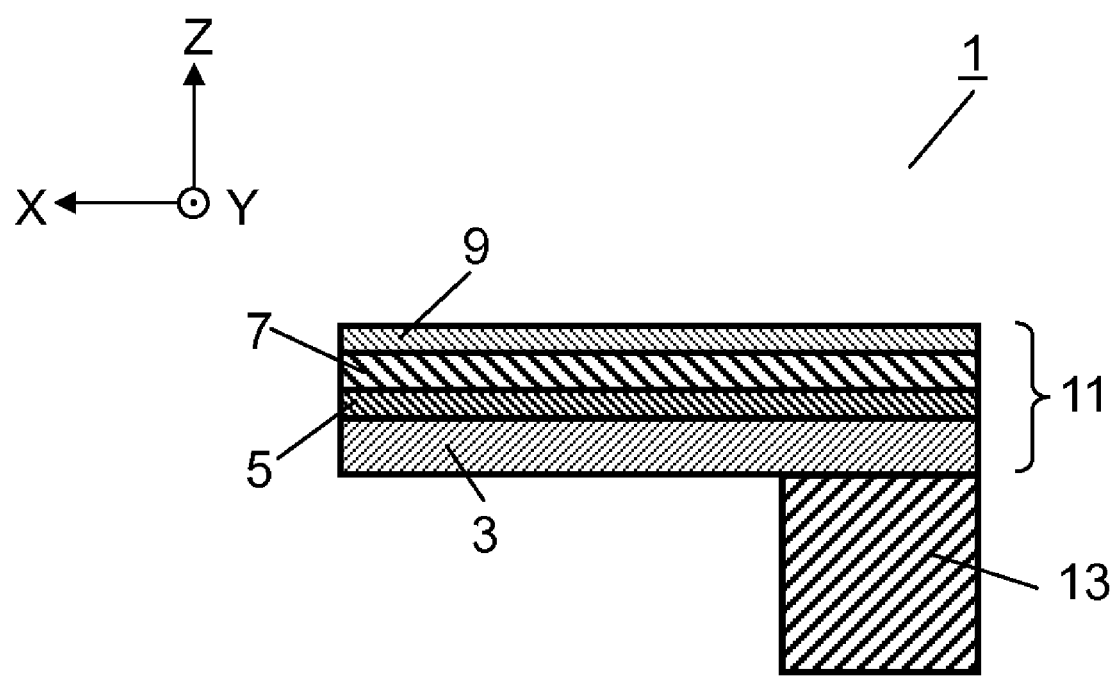
FIG. 3 is a cross-sectional view of the present actuator.

FIG. 1 shows an actuator 1 according to the present first embodiment. The actuator 1 comprises a laminate 11, a support 13, and a third electrode 25. As shown in FIG. 3, the laminate 11 comprises a substrate 3, a first electrode 5, a piezoelectric layer 7, and a second electrode 9 in this order.

The example of the support 13 is a silicon substrate with an oxidized surface. The example of the third electrode 25 is a stacked electrode composed of a gold layer and a titanium layer. The stacked electrode may be formed by patterning a titanium film on which gold films are deposited repeatedly with a dry-etching method. The third electrode 25 is not required to be disposed on the support 13. $L_X$ and $L_Y$ denote a length of the actuator 1 along the X direction and a width thereof along the Y direction, respectively.

Figure 2:
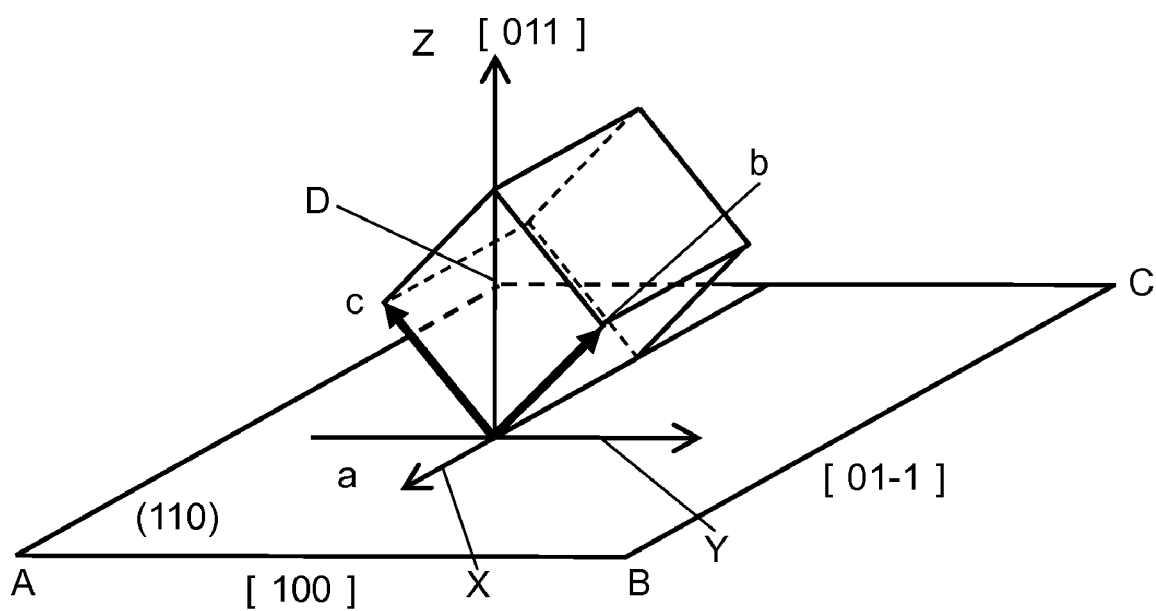
FIG. 2 is a graphical illustration for the definition of coordinate axes.

FIG. 2 is a graphical illustration for the definition of coordinate axes. As shown in FIG. 2, +X direction, +Y direction, and +Z direction denote [100] axis direction, [01-1] axis direction, and [011] axis direction, respectively.

In FIG. 2, a parallelogram ABCD has (110) plane orientation. The parallelogram ABCD has the normal line of the [011] axis direction, namely, +Z direction.

FIG. 3 shows an A-A' cross-sectional view of the actuator 1. The example of the material of the substrate 3 may be magnesium oxide (MgO) or strontium titanate ($SrTiO_3$). An MgO (110) substrate is preferred in light of a preferential orientation along +Z direction of the piezoelectric layer 7, which is described later.

The first electrode 5 is preferentially oriented along the +Z direction. The first electrode 5 may be composed of, for example, a metal film or an oxide electric conductive film. More than one film may be used. The metal includes platinum (Pt), palladium (Pd), and gold (Au). The oxide electric conductor includes nickel oxide (NiO), ruthenium oxide ($RuO_2$), iridium oxide ($IrO_2$), strontium ruthenate ($SrRuO_3$), and lanthanum nickelate ($LaNiO_3$).

The piezoelectric layer 7 is composed of (Bi, Na, Ba) $TiO_3$. The piezoelectric layer 7 may contain a little amount of impurities such as manganese and iron to improve the property of the piezoelectric layer 7. The piezoelectric layer 7 is preferentially oriented along the +Z direction, namely, the [011] axis direction. This characterizes the present invention. The piezoelectric layer 7 may be formed with a spattering method.

Preferably, the second electrode 9 is formed of gold.

The first electrode 5 is electrically connected with the third electrode 25. The third electrode 25 may be provided to apply a voltage to the first electrode 5. However, the third electrode 25 is provided optionally. The support 13 immobilizes the one end of the laminate 11. The support 13 may be adhered to the laminate 11. Epoxy resin or solder may be used. A portion of the substrate 3 may be etched to form the support 13.

The actuator 1 according to the first embodiment comprises the first electrode 5, the piezoelectric layer 7 composed of (Bi, Na, Ba) $TiO_3$, and the second electrode 9. The piezoelectric layer 7 is interposed between the first electrode 5 and the second electrode 9. A voltage is applied between the first electrode 5 and the second electrode 9 to drive the actuator 1. The one end portion of the laminate 11 is immobilized, whereas the other end portion is displaced along the Z direction in the cross-section view of XZ plane.

The method for driving the actuator 1 is described below.

Figure 4A:
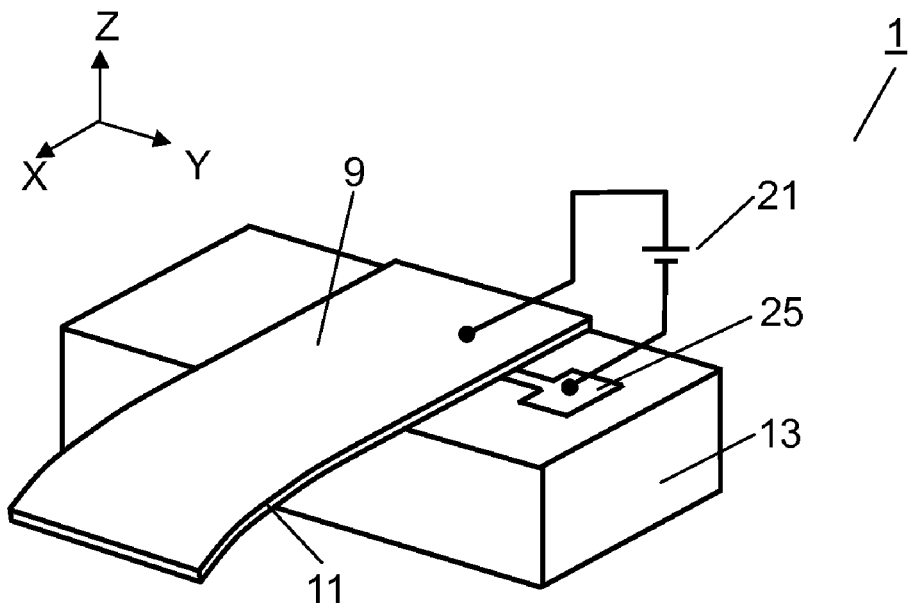
FIGS. 4A and 4B are schematic perspective views showing the displacement of the present actuator.
Figure 4B:
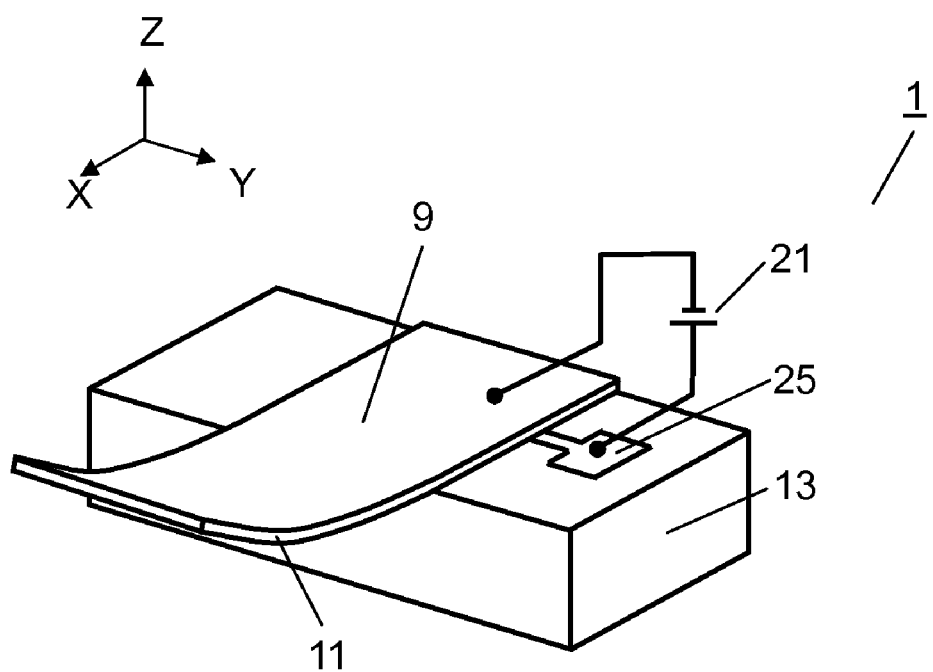

FIGS. 4A and 4B show the movement of the actuator 1. As shown in FIG. 4A, when the voltage applied to the first electrode 5 is lower than the voltage applied to the second electrode 9, the other end portion of the actuator 1 is displaced along the −Z direction. As shown in FIG. 4B, when the voltage applied to the first electrode 5 is higher than the voltage applied to the second electrode 9, the other end portion of the actuator 1 is displaced along the +Z direction.

Figure 5A:
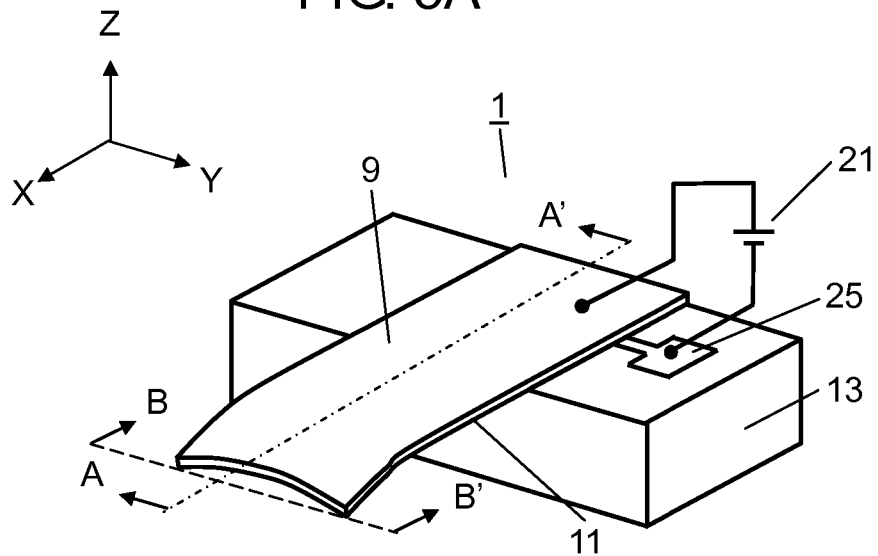
FIG. 5A is a schematic perspective view showing another displacement of the present actuator.

However, when the voltage is applied between the first electrode 5 and the second electrode 9, the other end portion of the actuator 1 is deformed along the Y direction, as shown in FIG. 5A. The term "displacement" used in the present specification means the movement along +Z or −Z direction. This is a preferred function required to the actuator. On the other hand, the term "deformation" used in the present specification means the curvature in YZ plane. This is a not preferred function, which fails to be required to the actuator. In other words, a greater displacement and a smaller deformation are requested.

Figure 5B:
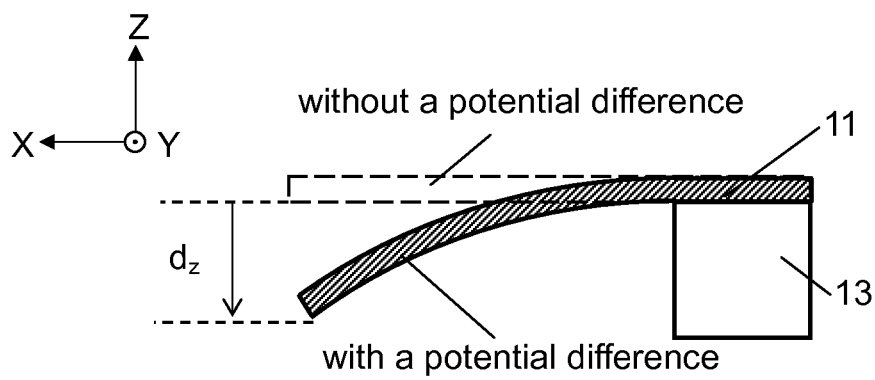
FIG. 5B is a cross-sectional view showing the displacement along the Z direction in the other end of the present actuator.

FIG. 5B is a cross-sectional view of the actuator 1 in XZ plane. FIG. 5B is used to describe the amount of the displacement of the other end portion. In FIG. 5B, $d_z$ denotes the distance along the Z direction between the position of the other end portion when no potential difference is applied to the actuator 1 and the position thereof when a potential difference is applied.

Figure 5C:
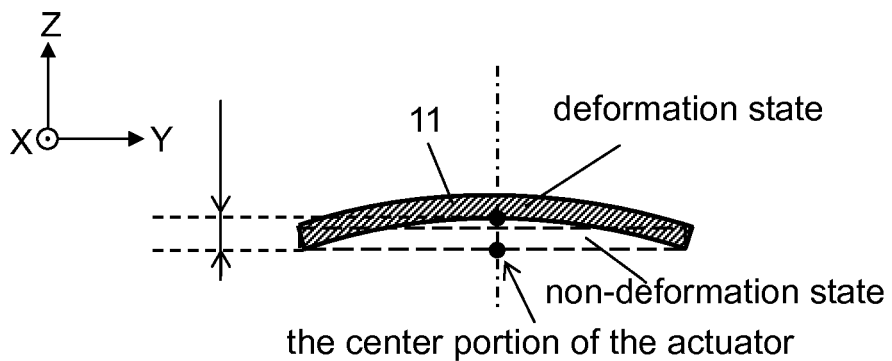
FIG. 5C is a cross-sectional view showing the deformation along the Y direction in the other end of the present actuator.

FIG. 5C is a cross-sectional view of the actuator 1 in YZ plane. FIG. 5C is used to describe the amount of the deformation of the other end portion. In FIG. 5C, the potential difference is applied to the actuator 1.

The broken line shows an ideal state (hereinafter, "non-deformation state") where the center portion of the actuator 1 exists on the line segment, which connects both of the ends of the actuator 1, when the actuator 1 is seen from the +X direction. On the other hand, in FIG. 5C, the solid line shows an actual state (hereinafter, "deformation state") where the center portion of the actuator 1 fails to exist on the line segment, which connects both of the ends of the actuator 1, when the actuator 1 is seen from the +X direction.

As shown in FIG. 5C, the both ends of the actuator 1 in the non-deformation state agree with the both ends of the actuator 1 in the deformation state. However, the center portion of the actuator 1 in the non-deformation state fails to agree with the center portion of the actuator 1 in the deformation state. The difference of the locations between these center portions is defined as $h_z$.

In other words, $h_z$ denotes the distance along the Z direction between the center portion of the imaginary line segment which connects both ends of the actuator 1, and the center portion of the actuator 1, when the actuator 1, to which the potential difference is applied, is seen from the +X direction.

An actuator 1 with a small value of $h_z/d_z$ is requested. Specifically, the value of $h_z/d_z$ is not more than 0.1. If the value of $h_z/d_z$ is more than 0.1, the other end portion of the actuator 1 may be broken.

An actuator 1 with greater $L_Y$ has a greater driving force. An actuator 1 with smaller $L_X$ has a greater stiffness. Accordingly, the value of $L_Y/L_X$ is preferred to be greater. Specifically, it is preferred that the value of $L_Y/L_X$ is not less than 0.1.

The maximum value of $L_Y$ is approximately 20 mm in light of the size of the substrate 3. When $L_Y$ is 20 mm, the minimum value of $L_X$ is approximately 1 mm in light of cutting off the piezoelectric layer 7. Accordingly, it is preferred that the value of $L_Y/L_X$ is not more than 20.

On the contrary, when $L_Y$ is greater, the value of $h_z/d_z$ is also greater. This is a collision.

The present actuator 1 is characterized by that the piezoelectric layer 7 is preferentially oriented along the +Z direction, and that the one end along the X direction is immobilized whereas the other end portion is displaced along the Z direction. This allows the value of $h_z/d_z$ of the present actuator to be smaller than that of the other actuator, even when the value of $L_Y/L_X$ is identical.

EXAMPLES

The following example gives a more detailed explanation of the present invention.

Example 1

In example 1, an actuator according to FIG. 1 is prepared as below.
[Preparation of the Laminate 11]
A Pt layer with [011] axis direction and a thickness of 250 nm was formed with RF magnetron sputtering on the surface of a MgO monocrystalline substrate with (110) plane orientation and a thickness of 0.5 mm. The MgO monocrystalline substrate and the Pt layer correspond to the substrate 3 and the first electrode 5, respectively.

The condition of the RF magnetron sputtering is described below:
Target: Pt metal
Atmosphere: argon (Ar) gas
RF output: 15W
Temperature of the substrate: 300 degrees Celsius.

Next, a (Bi, Na, Ba) TiO$_3$ layer with a thickness of 2.7 μm was deposited with RF magnetron sputtering on the surface of the first electrode 5 to form a piezoelectric layer 7.

The condition of the RF magnetron sputtering is described below:
Target: the above-mentioned composition
Atmosphere: mixed gas with Ar and Oxygen in which a flow ratio of Ar/O$_2$ is 50/50.
RF output: 170W
Temperature of the substrate: 650 degrees Celsius.

Figure 6:
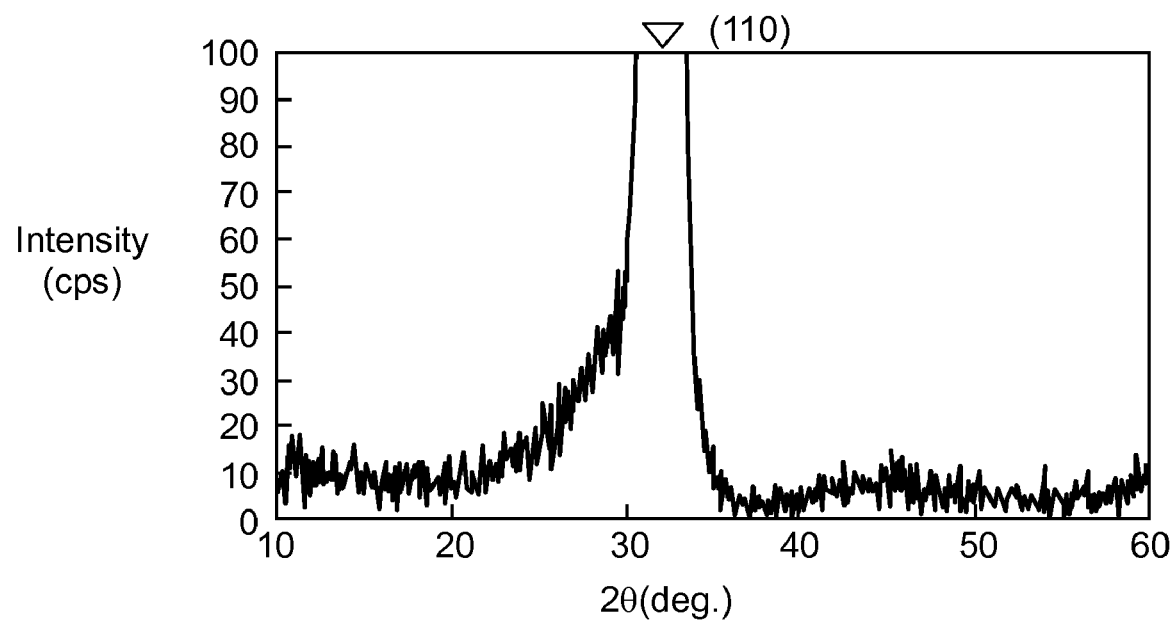
FIG. 6 is an X-ray diffraction profile of the piezoelectric film according to example 1.

The crystalline structure of the piezoelectric layer 7 was analyzed with X-ray diffraction. FIG. 6 shows the result of X-ray diffraction profile. A reflection peak of (Bi, Na, Ba) TiO$_3$ layer with (110) plane orientation (namely, [011] axis direction, see FIG. 2) was only observed except for reflection peaks of the MgO substrate and the Pt layer. The intensity of the (110) reflection peak was as strong as 255,956 cps. The profile shown in FIG. 6 means that the piezoelectric layer 7 according to the present example 1 has extremely strong orientation along the +Z direction.

Finally, an Au layer with a thickness of 100 nm was formed with deposition on the surface of the piezoelectric layer 7. The Au layer corresponds to the second electrode 9. Thus, the laminate 11 was prepared.

[Evaluation of Piezoelectric Performance]

The piezoelectric performance of the laminate 11 was evaluated as below. The laminate 11 was cut off to form some plates with a length of 20 mm and a width of 2 mm each. The plate was adhered to the support 13 to prepare a cantilever.

Figure 7A:
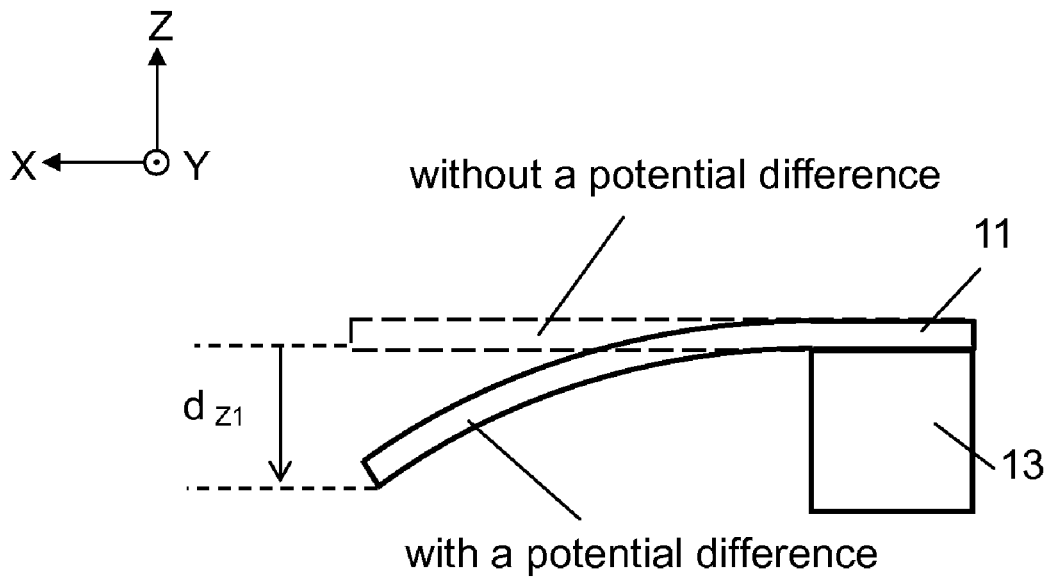
FIG. 7A is a drawing for explaining the value of $d_{Z1}$.
Figure 7B:
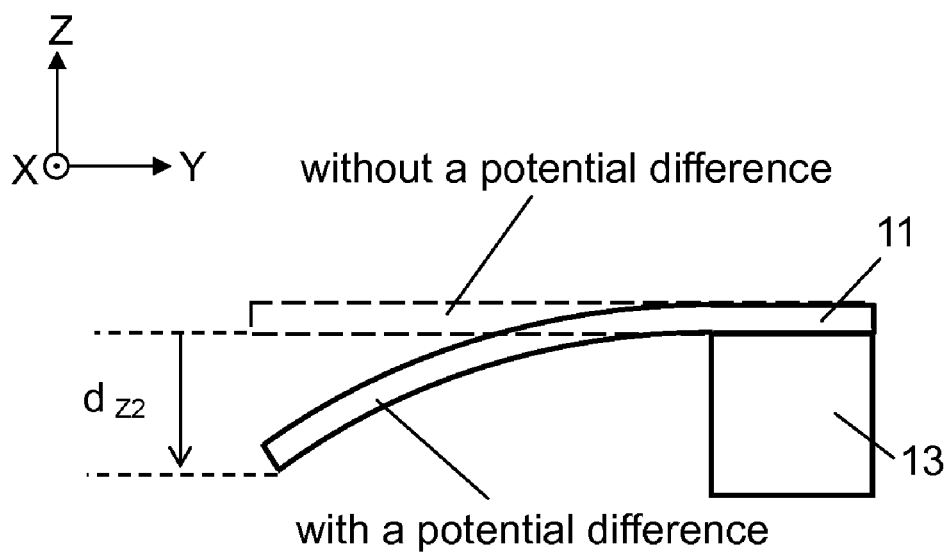
FIG. 7B is a drawing for explaining the value of $d_{Z2}$.

FIG. 7A shows a cantilever utilizing electrostriction along the X direction. $d_{Z1}$ denotes an amount of the displacement of the one end portion of the cantilever along the −Z direction. FIG. 7B shows a cantilever utilizing electrostriction along the Y direction. $d_{Z2}$ denotes an amount of the displacement of the one end portion of the cantilever along the −Z direction.

Figure 8A:
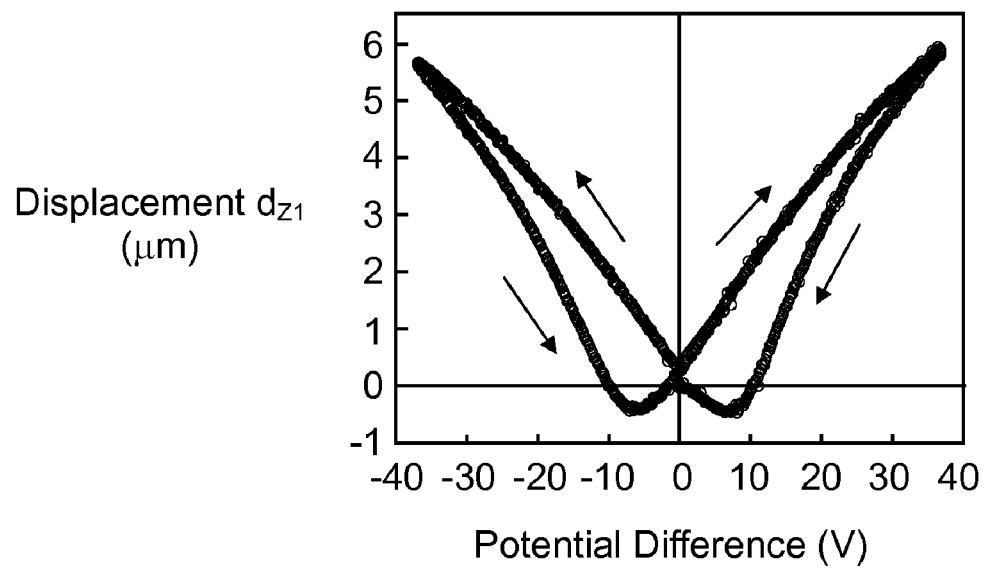
FIG. 8A is a graph showing the results of the evaluation of the piezoelectric performance according to the example 1, corresponding to FIG. 7A.
Figure 8B:
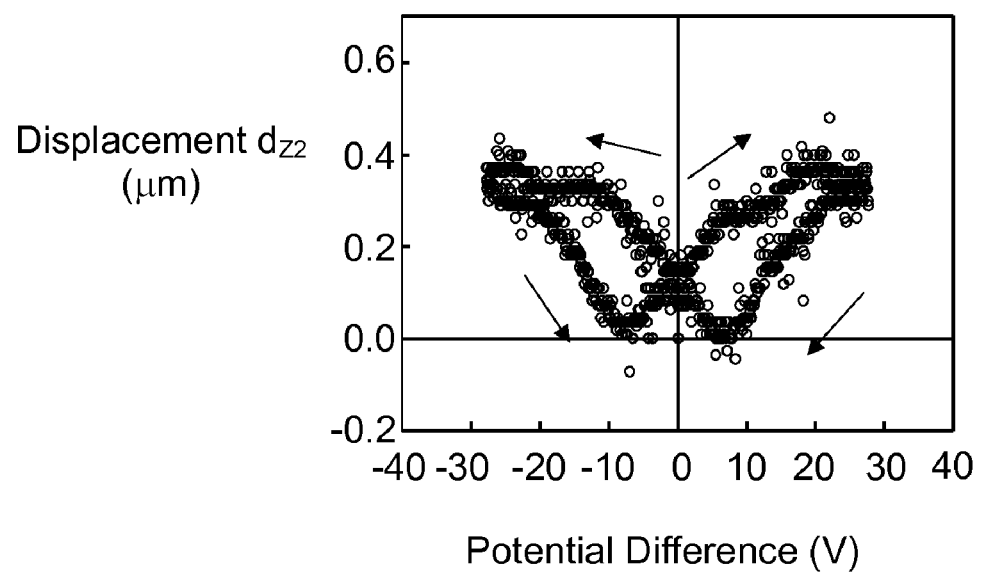
FIG. 8B is a graph showing the results of the evaluation of the piezoelectric performance according to the example 1, corresponding to FIG. 7B.

The amount of the displacement of the one end portion of the cantilever was measured with a laser displacement gauge, when a potential difference was applied between the first electrode 5 and the second electrode 9. FIG. 8A and FIG. 8B show the results thereof. FIG. 8A shows a graph with a horizontal axis of the potential difference and a vertical axis of $d_{Z1}$. FIG. 8B shows a graph with a horizontal axis of the potential difference and a vertical axis of $d_{Z2}$.

As understood from FIG. 8A and FIG. 8B, $d_{Z1}$ is much greater than $d_{Z2}$. That is, a cantilever in which the one end portion along the X direction is immobilized has an extremely great amount of the displacement ($d_{Z1}$), whereas a cantilever in which the one end portion along the Y direction is immobilized has an extremely small amount of the displacement ($d_{Z2}$). The present invention is based on this discovery.

The amount of the displacement when a potential difference of 10 V was applied was converted to a piezoelectric constant $d_{31}$. The piezoelectric constant $d_{31}$ according to FIG. 8A is −130 pC/N, whereas the piezoelectric constant $d_{31}$ according to FIG. 8B is −10 pC/N. The (Bi, Na, Ba) TiO$_3$ layer 7 with [011] axis orientation comprised the piezoelectric property with great aeolotropy. Specifically, the piezoelectric constant $d_{31}$ along the X direction was ten times more than the piezoelectric constant $d_{31}$ along the Y direction.

In an actuator, it is preferred that an amount of the displacement fails to generate hysteresis relative to an applied voltage. This requires the applied voltage to be not more than 20 V. Therefore, the maximum value of the applied voltage was set to be 10 V in the present example.

[Preparation of the Actuator]

Figure 9:
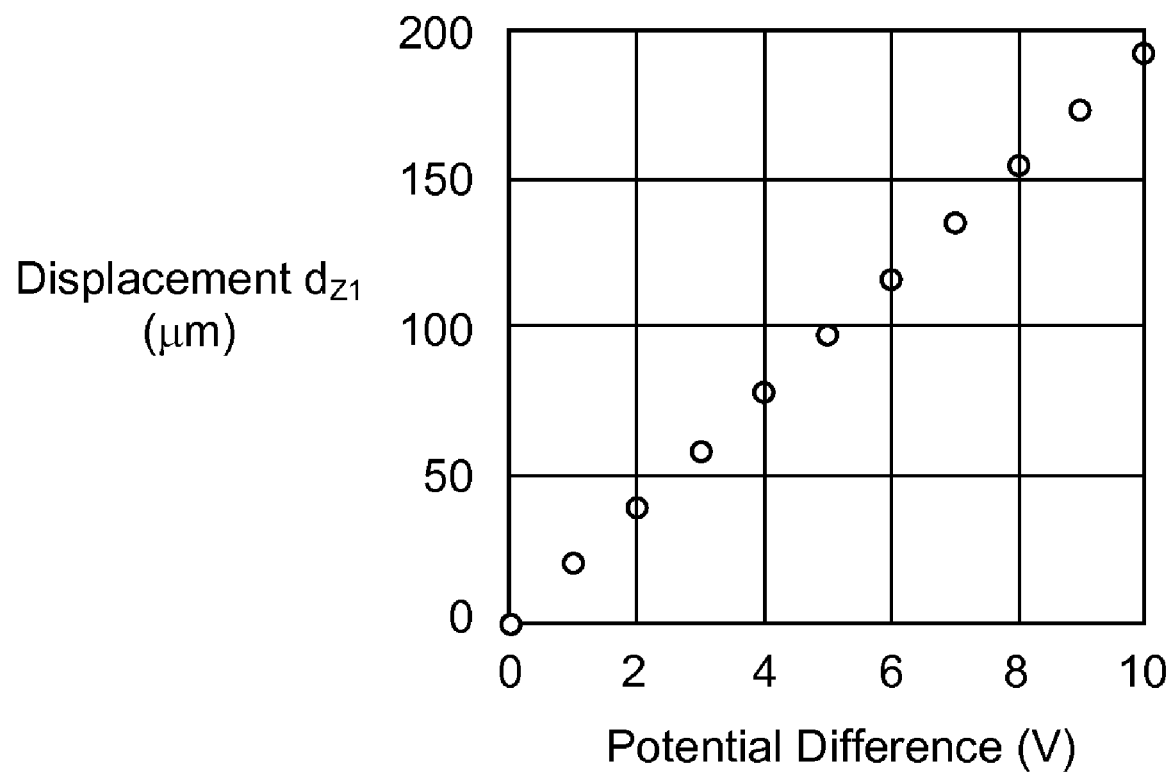
FIG. 9 is a graph showing the relationships between the potential difference and the amount of the displacement in the actuator according to the example 1.
Figure 10A:
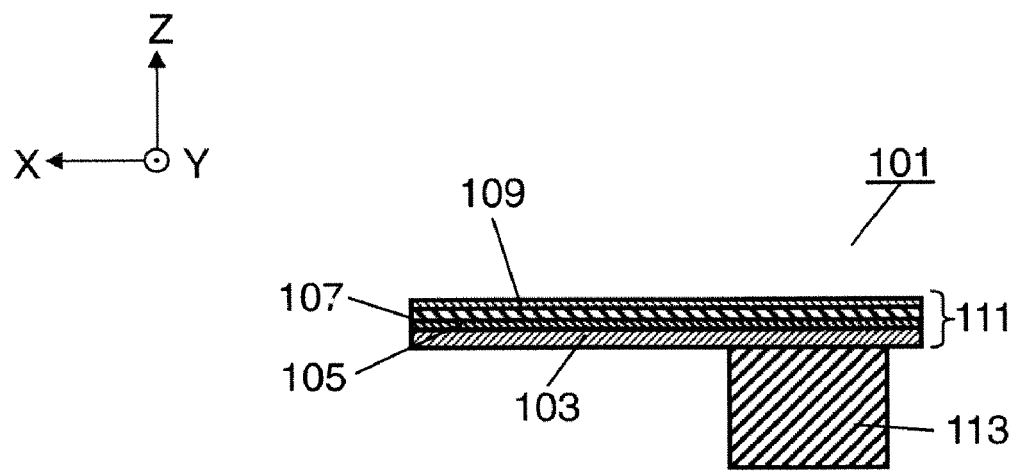
FIG. 10A is a cross-sectional view of a prior actuator comprising a piezoelectric film.
Figure 10B:
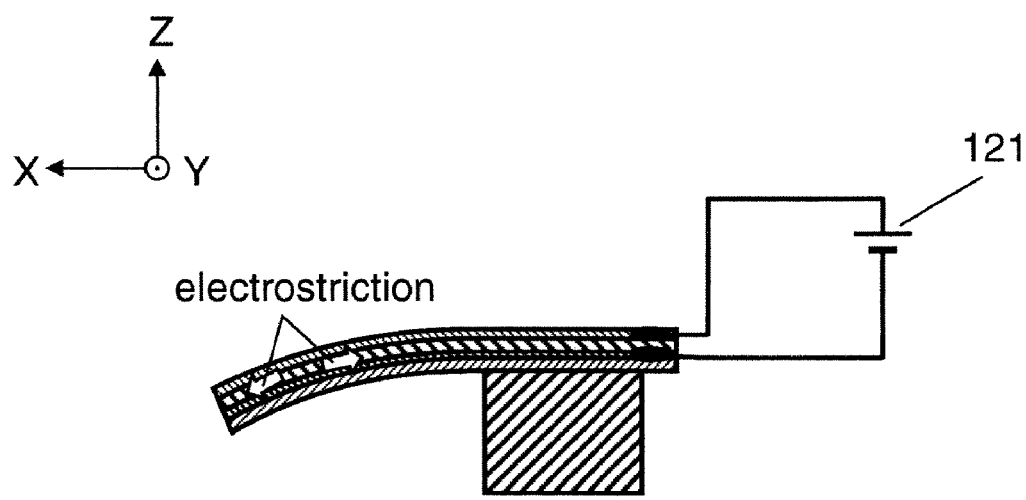
FIG. 10B is a cross-sectional view of the prior actuator when a potential difference is applied.

In order to obtain the greater amount of the displacement, the MgO monocrystalline substrate was polished to render the thickness thereof to be 50 μm. The plate cut off from the laminate 11 was adhered with epoxy resin to the support 13 comprising the third electrode 25 to immobilize the laminate 11. The first electrode 5 was electrically connected to third electrode 25 with silver paste. Thus, the actuator 1 was prepared. The amount of the displacement $d_{Z1}$ was measured with the laser displacement gauge, similarly to FIG. 8A. FIG. 9 shows the result thereof.

FIG. 9 shows a graph with a horizontal axis of the potential difference and a vertical axis of the amount of the displacement $d_{Z1}$. In FIG. 9, the axis direction similar to FIG. 7 was used. When the potential difference is 10 V, a great displacement of approximately 200 μm was obtained.

[Research of the Relationship Between the Value of $L_Y/L_X$ and the Value of $h_z/d_z$]

The laminate 11 was cut off to form a plurality of plates with various lengths $L_X$ and various widths $L_Y$. Each of the one end portions of the plates was immobilized to prepare various actuators.

TABLE 1

| $L_X$(mm) | 20 | 20 | 20 | 20 |
|---|---|---|---|---|
| $L_Y$(mm) | 2 | 5 | 10 | 15 |
| $h_z$(μm) | 167 | 162 | 158 | 161 |
| $d_z$(μm) | <2 | <2 | <2 | 3 |
| $L_Y/L_X$ | 0.10 | 0.25 | 0.5 | 0.75 |
| $h_z/d_z$ | <0.01 | <0.01 | <0.01 | 0.02 |

| $L_X$(mm) | 20 | 13 | 10 | 8 |
|---|---|---|---|---|
| $L_Y$(mm) | 20 | 20 | 20 | 20 |
| $h_z$(μm) | 164 | 70 | 42 | 24 |
| $d_z$(μm) | 5 | 4 | 4 | 4 |
| $L_Y/L_X$ | 1 | 1.5 | 2 | 2.5 |
| $h_z/d_z$ | 0.03 | 0.06 | 0.10 | 0.17 |

Table 1 shows the relationship between the value of $L_Y/L_X$ and the value of $h_z/d_z$, both of which each of actuators 1 according to the present example 1 has. The actuator 1 comprised the MgO monocrystalline substrate 3 with a thickness of 50 μm. The $h_z$ was the value measured when the potential difference between the first electrode 5 and the second electrode 9 is 10 V.

As shown in Table 1, when the value of $L_Y/L_X$ increases, the value of $h_z/d_z$ also increases. When the value of $L_Y/L_X$ is 0.1 such that the minimum condition to obtain a driving force is satisfied, the value of $h_z/d_z$ was so small (<0.01) that it was not able to be measured. Even when the value of $L_Y/L_X$ is 2.0, the value of $h_z/d_z$ was 0.10. The inequality $h_z/d_z \leq 0.1$ was satisfied. Accordingly, the actuators according to the example 1 had a greater amount of the displacement and a smaller amount of the deformation.

Comparative Example 1

The actuator according to comparative example 1 was prepared similarly to the example 1 except only that MgO monocrystalline substrate with (100) plane orientation was used in place of MgO monocrystalline substrate with (110)

plane orientation. Both of the first electrode 5 and the piezoelectric layer 7 oriented along the [001] axis direction in accordance with the (100) plane direction of the substrate 3.

Similarly to the example 1, a piezoelectric constant $d_{31}$ was evaluated. The piezoelectric constant $d_{31}$ of the piezoelectric layer 7 according to the comparative example 1 is −130 pC/N along the [100] axis direction, which is in-plane. The piezoelectric constant $d_{31}$ along the [010] axis direction, which orthogonal to the [100] axis direction is also −130 pC/N. This means that the piezoelectric layer 7 according to the comparative example 1 had an in-plane isotropic piezoelectric property.

Table 2 shows the relationships between the value of $L_Y/L_X$ and the value of $h_Z/d_Z$ of the actuators according to the comparative example 1.

TABLE 2

| $L_X$(mm) | 20 | 20 | 20 | 20 |
|---|---|---|---|---|
| $L_Y$(mm) | 2 | 5 | 10 | 15 |
| $h_z$(μm) | 192 | 191 | 193 | 193 |
| $d_z$(μm) | <2 | 3 | 13 | 29 |
| $L_Y/L_X$ | 0.10 | 0.25 | 0.5 | 0.75 |
| $h_z/d_z$ | <0.01 | 0.02 | 0.07 | 0.15 |

Because the piezoelectric property is isotropic, in Table 2, when the value of $L_Y/L_X$ is identical, the value of $h_z/d_z$ was greater than that of Table 1. For this reason, the upper limit value of $L_Y/L_X$ which satisfies that the value of $h_z/d_z$ is less than 0.1 was approximately 0.5. The upper limit value is one-fourth times as great as the upper limit value of $L_Y/L_X$ according to the example 1 (approximately, 2.0). Furthermore, the actuators according to the comparative example 1 have about one-fourth times driving forth, compared to the actuators according to the example 1.

INDUSTRIAL APPLICABILITY

An actuator according to the present invention may be used preferably for MEMS (Micro Electro Mechanical Systems) because of its great driving force.

REFERENCE MARKS IN THE DRAWINGS

| 1, 101 | Actuator |
|---|---|
| 3, 103 | Substrate |
| 5, 105 | First electrode |
| 7, 107 | Piezoelectric layer |
| 9, 109 | Second electrode |
| 11, 111 | Laminate |
| 13, 113 | Support |
| 21, 121 | Electric power supply |
| 25 | Third Electrode |

The invention claimed is:

1. An actuator comprising a first electrode, a piezoelectric layer composed of $(Bi,Na,Ba)TiO_3$, and a second electrode,
   the piezoelectric layer is interposed between the first electrode and the second electrode,
   +X direction, +Y direction, and +Z direction denote [100] direction, [01-1] direction, and [011] direction of the first electrode, respectively, and
   the piezoelectric layer is preferentially oriented along the +Z direction.

2. A method for driving an actuator, the method comprising the following steps (a) and (b):
   a step (a) of preparing the actuator, wherein:
      the actuator comprises a first electrode, a piezoelectric layer composed of $(Bi,Na,Ba)TiO_3$, and a second electrode,
      the piezoelectric layer is interposed between the first electrode and the second electrode,
      when +X direction, +Y direction, and +Z direction denote [100] direction, [01-1] direction, and [011] direction of the first electrode, respectively, the piezoelectric layer is preferentially oriented along the +Z direction, and
      one end portion of the actuator along the X direction is immobilized; and
   a step (b) of applying a potential difference between the first electrode and the second electrode to cause the other end portion of the actuator along the X direction to be displaced along the Z direction.

3. The method of claim 2, wherein:
   the actuator further comprises a support, and
      the second electrode is interposed between the support and the piezoelectric layer.

4. The method of claim 2, wherein:
   in the step (b), the voltage applied to the first electrode is lower than the voltage applied to the second electrode, and
   the other end portion is displaced along the −Z direction.

5. The method of claim 2, wherein:
   in the step (b), the voltage applied to the first electrode is higher than the voltage applied to the second electrode, and
   the other end portion of the actuator is displaced along the +Z direction.

6. The method of claim 2, wherein
   a value of $h_z/d_z$ is not more than 0.1,
   the $h_z$ denotes the distance along the Z direction between the center portion of a line segment, which connects both ends of the actuator, and the center portion of the actuator, when the actuator, to which the potential difference is applied in the step (b), is seen from the +X direction, and
   the $d_z$ denotes the distance along the Z direction between the position of the other end portion when no potential difference is applied to the actuator and the position of the other end portion when the potential difference is applied.

7. The method of claim 2, wherein
   a value of $L_Y/L_X$ is not less than 0.1 and not more than 2, and $L_x$ and $L_y$ denote a length of the actuator along the X direction and a width thereof along the Y direction, respectively.

8. The method of claim 6, wherein
   a value of $L_Y/L_X$ is not less than 0.1 and not more than 2, and $L_x$ and $L_y$ denote a length of the actuator along the X direction and a width thereof along the Y direction, respectively.

* * * * *